United States Patent
Zhang et al.

(10) Patent No.: US 9,444,493 B2
(45) Date of Patent: Sep. 13, 2016

(54) ENCODER WITH TRANSFORM ARCHITECTURE FOR LDPC CODES OVER SUBFIELDS USING MESSAGE MAPPING

(71) Applicant: SANDISK ENTERPRISE IP LLC, Dallas, TX (US)

(72) Inventors: Xinmiao Zhang, Seattle, WA (US); Ying Yu Tai, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 86 days.

(21) Appl. No.: 14/316,117

(22) Filed: Jun. 26, 2014

(65) Prior Publication Data

US 2015/0381204 A1 Dec. 31, 2015

(51) Int. Cl.
| | |
|---|---|
| *G11C 29/00* | (2006.01) |
| *H03M 13/11* | (2006.01) |
| *H03M 13/00* | (2006.01) |

(52) U.S. Cl.
CPC ......... *H03M 13/116* (2013.01); *H03M 13/611* (2013.01); *H03M 13/616* (2013.01)

(58) Field of Classification Search
CPC ......... H03M 13/116; H03M 13/1177; H03M 13/1188; H03M 13/1515; H03M 13/1595; H03M 13/00; H03M 13/151; G06F 11/1008; G06F 17/14
USPC ................................................. 714/767, 773
See application file for complete search history.

(56) References Cited

U.S. PATENT DOCUMENTS

| | | | |
|---|---|---|---|
| 3,878,542 A | 4/1975 | Myer | |
| 4,335,398 A | 6/1982 | Yamada | |
| 4,835,688 A | 5/1989 | Kimura | |
| 6,308,295 B1 | 10/2001 | Sridharan et al. | |
| 8,014,361 B2* | 9/2011 | Ozluturk | H04W 74/004 370/208 |
| 8,281,213 B1* | 10/2012 | Matache | H03M 13/116 370/206 |
| 8,286,049 B1 | 10/2012 | McFarland et al. | |
| 2007/0067695 A1 | 3/2007 | Griesser et al. | |
| 2008/0025424 A1 | 1/2008 | Yang et al. | |
| 2010/0100790 A1 | 4/2010 | Sutskover | |
| 2011/0252286 A1 | 10/2011 | Li et al. | |
| 2012/0110418 A1* | 5/2012 | Ma | H03M 13/1157 714/773 |
| 2012/0257895 A1 | 10/2012 | Djordjevic et al. | |
| 2013/0173988 A1 | 7/2013 | Chen et al. | |
| 2014/0006850 A1 | 1/2014 | Aliev et al. | |
| 2014/0040532 A1 | 2/2014 | Watanabe et al. | |

(Continued)

OTHER PUBLICATIONS

Tarable, Alberto et al. "Mapping Interleaving Laws to Parallel Turbo and LDPC Decoder Architectures," IEEE Transactions on Information Theory, vol. 50, No. 9, Sep. 2004, pp. 2002-2009.

(Continued)

*Primary Examiner* — David Ton
(74) *Attorney, Agent, or Firm* — Toler Law Group, PC (57) ABSTRACT

A low-density parity-check (LDPC) encoder is configured to encode data for storage into a non-volatile memory of a data storage device. The LDPC encoder includes a message mapping circuit configured to receive an input message and to generate a mapped message based on the input message. The LDPC encoder also includes a matrix multiplier circuit configured to multiply the mapped message with columns of a Fourier transform of an LDPC generator matrix to generate at least a portion of a transform of an LDPC codeword. The LDPC encoder is configured to provide the transform of the LDPC codeword to an inverse Fourier transform circuit to generate the LDPC codeword.

22 Claims, 4 Drawing Sheets

(56) References Cited

U.S. PATENT DOCUMENTS

2015/0301985 A1    10/2015    Zhang et al.
2015/0381204 A1    12/2015    Zhang et al.
2015/0381205 A1    12/2015    Zhang et al.

OTHER PUBLICATIONS

Hocevar, Dale E. "A Reduced Complexity Decoder Architecture Via Layered Decoding of LDPC Codes," IEEE Workshop on Signal Processing Systems, Oct. 2004, pp. 107-112.

Neeb, Christian et al. "Network-on-Chip-Centric Approach to Interleaving in High Throughput Channel Decoders," IEEE International Symposium on Circuits and Systems, vol. 2, May 2005, pp. 1766-1769.

Li, Zongwang et al. "Efficient Encoding of Quasi-Cyclic Low-Density Parity-Check Codes," IEEE Transactions on Communications, vol. 54, Issue1, Jan. 2006, pp. 71-81.

Gunnam, Kiran et al. "Multi-Rate Layered Decoder Architecture for Block LDPC Codes of the IEEE 802.11n Wireless Standard," IEEE International Symposium on Circuits and Systems, May 2007, pp. 1645-1648.

Darabiha, Ahmad et al. "Power Reduction Techniques for LDPC Decoders," IEEE Journal of Solid-State Circuits, vol. 43, No. 8, Aug. 2008, pp. 1835-1845.

Lee, Kihoon et al. "A High-Speed Low-Complexity Concatenated BCH Decoder Architecture for 100 Gb/s Optical Communications," Springer Science+Business Media, LLC, Aug. 2010, 13 pages.

Huang, Q. et al. "A Low-Complexity Encoding of Quasi-Cyclic Codes Based on Galois Fourier Transform," Cornell University Library, arXiv.org > cs > arXiv:1301.3220v1, submitted Jan. 15, 2013, 8 pages.

Huang, Q. et al. "Low-Complexity Encoding of Quasi-Cyclic Codes Based on Galois Fourier Transform," IEEE Transactions on Communications, vol. 62, Issue 6, Jun. 2014, 10 pages.

Zhang, Xinmiao et al. "High-Speed Multi-Block-Row Layered Decoder for Low Density Parity Check (LDPC) Codes," U.S. Appl. No. 14/257,800, filed Apr. 21, 2014, 41 pages.

Zhang, Xinmiao et al. "Low Complexity Partial Parallel Architectures for Fourier Transform and Inverse Fourier Transform Over Subfields of a Finite Field," U.S. Appl. No. 14/258,679, filed Apr. 22, 2014, 44 pages.

Zhang, Xinmiao "Interleaved Layered Decoder for Low-Density Parity Check Codes," U.S. Appl. No. 14/258,843, filed Apr. 22, 2014, 34 pages.

Zhang, Xinmiao "Modified Trellis-Based Min-Max Decoder for Non-Binary Low-Density Parity-Check Error-Correcting Codes," U.S. Appl. No. 14/272,621, filed May 8, 2014, 33 pages.

Zhang, Xinmiao et al. "Encoder for Quasi-Cyclic Low-Density Parity-Check Codes over Subfields Using Fourier Transform," U.S. Appl. No. 14/316,128, filed Jun. 26, 2014, 36 pages.

Notice of Allowance and Fee(s) Due mailed Dec. 31, 2015 in U.S. Appl. No. 14/316,128, 12 pages.

Notice of Allowance and Fee(s) Due mailed Apr. 13, 2016 in U.S. Appl. No. 14/316,128, 5 pages.

Non-Final Office Action mailed May 10, 2016 in U.S. Appl. No. 14/258,679, 6 pages.

Notice of Allowance and Fee(s) Due mailed Jul. 20, 2016 in U.S. Appl. No. 14/316,128, 5 pages.

\* cited by examiner

ENCODER WITH TRANSFORM ARCHITECTURE FOR LDPC CODES OVER SUBFIELDS USING MESSAGE MAPPING

FIELD OF THE DISCLOSURE

The present disclosure is generally related to encoding data.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more. Although increasing the number of bits per cell and reducing device feature dimensions may increase the storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g. "parity bits") that may be stored with the data as an ECC codeword. Conventionally, encoding data to generate an ECC codeword, such as a quasi-cyclic low-density parity-check (QC-LDPC) codeword, includes multiplying the data with a generator matrix. A systematic QC-LDPC generator matrix includes a parity portion composed of circulant matrices. Because each row of a circulant matrix is a cyclically shifted version of the previous row of the circulant matrix, QC-LDPC encoding may be simplified using a shift-register type encoder architecture. However, due to a relatively high density of non-zero entries in irregular locations in the parity portion of a QC-LDPC generator matrix, QC-LDPC encoders conventionally include a dedicated multiplier circuit for each column of the parity portion for multiplying a message symbol with the generator matrix in order to reduce encoding latency.

To reduce the number of multipliers used in a QC-LDPC encoder, a Fourier transform of the generator matrix over a finite field may be used. Because the Fourier transform of a circulant matrix is a diagonal matrix, non-zero entries are only located along the matrix diagonal and a reduced number of multipliers may be used, with one dedicated multiplier for each block column of circulant matrices in the parity portion of the generator matrix for multiplying a message symbol with the generator matrix. However, multiplying an input message (e.g., data to be encoded) with the Fourier transform of the generator matrix results in an output codeword with symbols that are elements of the finite field corresponding to the transformed generator matrix (e.g., Galois field $GF(2^6)$), rather than of the input message (e.g., a "binary" message with symbols that are elements of $GF(2)$).

In order to obtain a binary codeword using a Fourier transform of the generator matrix of a QC-LDPC code, additional processing has been previously proposed that is applied to the input message and to the transformed generator matrix. However, the proposed additional processing includes performing permutations of rows and columns of the transformed generator matrix and also processing the input message by linearly combining together elements that appear in different "blocks" of the input message (i.e., sections of the input message that correspond to different circulant matrices in the generator matrix) to generate a mapped message. In addition, a reverse permutation of the product of the mapped message and the permuted transformed generator matrix is required to obtain a codeword. The multiple permutations add additional complexity and latency of encoding, and the message mapping across multiple "blocks" further increases latency and storage requirements because large portions or all of the input message have to be received and stored before message mapping can be completed. Another drawback of the previously proposed encoding process is that it is limited to binary LDPC codes and is not applicable to non-binary LDPC codes.

SUMMARY

A low-density parity-check (LDPC) encoder architecture multiplies mapped messages with a Fourier transform of an LDPC generator matrix over a finite field to generate LDPC codes over a sub-field of the finite field. The LDPC encoder architecture may use a reduced number of dedicated multipliers as compared to non-transform LDPC encoders without reduction of decoding throughput. Because the Fourier transform of the LDPC generator matrix is used instead of a permuted version of the Fourier transform of the LDPC generator matrix, additional latency, complexity, and buffering associated with post-multiplication reverse permutation and inter-block message mapping may be avoided. Additional reduction in computational complexity may be achieved by exploiting properties of cyclotomic cosets of the finite field with respect to the sub-field, and the encoder architecture can be applied to binary or non-binary LDPC codes.

DETAILED DESCRIPTION

Although certain examples are described herein with reference to a data storage device, it should be appreciated that techniques described herein are applicable to other implementations. For example, information can be received by a communication device (e.g., wirelessly or from a wired network) alternatively or in addition to accessing information from a memory. As an illustrative example, LDPC codes may be utilized to improve reliability of communications (wired or wireless).

Conventionally, the encoding of LDPC codes is performed according to c=mG, where c is the resulting codeword, m is the message (e.g., a vector of message symbols) and G is a generator matrix. A systematic generator matrix for a QC-LDPC code can be expressed as:

$$G = \begin{bmatrix} I & 0 & \ldots & 0 & G_{0,0} & \ldots & G_{0,n-k-1} \\ 0 & I & \ldots & 0 & G_{1,0} & \ldots & G_{1,n-k-1} \\ \vdots & \vdots & \ddots & \vdots & \vdots & \ddots & \vdots \\ 0 & 0 & \ldots & I & G_{k-1,0} & \ldots & G_{k-1,n-k-1} \end{bmatrix} \quad \text{Eq. 1}$$

where I is the identity matrix and $G_{i,j}$ ($0 \le i < k$, $0 \le j < n-k$) are circulant matrices of the same size as the identity matrix. The non-identity portion of G (i.e., the columns of G that consist of $G_{i,j}$ submatrices) is also referred to as the parity portion of G. In a circulant matrix, each row is the previous row cyclically shifted by one position. Due to this property of circulant matrices, the encoder of a QC-LDPC code can be implemented by a shift-register architecture. However, the matrices $G_{i,j}$ are relatively dense, and nonzero entries in each row of $G_{i,j}$ appear at irregular locations. Therefore, in conventional encoders a dedicated multiplier is used for each parity column for multiplying a message symbol with the generator matrix, and (n−k)e multipliers are used to multiply a message symbol by G, when the dimension of each submatrix is e×e.

A Fourier-transformed method has been proposed to reduce the encoder complexity of QC-LDPC codes. In the following example, the size of the circulant submatrices in G is e=($2^r$−1), where r is a positive integer, α is a primitive element of finite field GF($2^r$), and V=[$\alpha^{-ij}$]($0 \le i, j < e$) is an e×e matrix over GF($2^r$), whose entry in the ith row and jth column is $\alpha^{-ij}$. The Fourier transform of an e-tuple vector, w=[w0, w1, ..., $w_{e-1}$], denoted as F(w), can be computed as:

$$F(w) = wV = w \begin{bmatrix} 1 & 1 & 1 & 1 & \ldots \\ 1 & \alpha^{-1} & \alpha^{-2} & \alpha^{-3} & \ldots \\ 1 & \alpha^{-2} & \alpha^{-4} & \alpha^{-8} & \ldots \\ \vdots & \vdots & \vdots & \vdots & \ddots \\ 1 & \alpha^{-(e-1)} & \alpha^{-(e-2)} & \alpha^{-(e-3)} & \ldots \end{bmatrix} \quad \text{Eq. 2}$$

The inverse of V is $V^{-1}=[\alpha_{ij}]$, and the inverse Fourier transform of a vector w is computed as $$F^{-1}(w) = wV^{-1} = w \begin{bmatrix} 1 & 1 & 1 & 1 & \ldots \\ 1 & \alpha & \alpha^2 & \alpha^3 & \ldots \\ 1 & \alpha^2 & \alpha^4 & \alpha^8 & \ldots \\ \vdots & \vdots & \vdots & \vdots & \ddots \\ 1 & \alpha^{e-1} & \alpha^{e-2} & \alpha^{e-3} & \ldots \end{bmatrix} \quad \text{Eq. 3}$$

If W is a circulant matrix and the first row of W is w, then $$W^F = V^{-1}WV = \text{diag}(d_0, d_1, \ldots, d_{e-1}) \quad \text{Eq. 4}$$

where [$d_0, d_1, \ldots, d_{e-1}$] equals F(w). The diagonal matrix $W^F$ is called the Fourier transform of the circulant matrix W. $V^{-1(k)}$ is defined as a k×k diagonal array of $V^{-1}$, and $V^{(n)}$ is defined as an n×n diagonal array of V. The Fourier transform of G is defined as $G^F = V^{-1(k)}GV^{(n)}$. Transformed encoding in the proposed Fourier-transformed method is performed according to:

$$c = = c^F V^{-1(n)}. \quad \text{Eq. 5}$$

The codeword 'c' computed using Eq. 5 is different from mG. However, c also satisfies the equality $cH^T=0$, where H is the parity-check matrix of the LDPC code. Therefore, the codeword c computed using Eq. 5 is also a valid codeword. In the transformed generator matrix $G^F$, the first ke columns are an identity matrix, and the last (n−k)e columns for the parity bits are diagonal matrices of dimension e×e. As a result, multiplying a message symbol with $G^F$ may be performed using n−k multipliers over GF($2^r$), as compared to the (n−k)e multipliers of non-transformed conventional encoders.

Even if m is over a subfield of GF($2^r$), the codeword c computed according to Eq. 5 is over GF($2^r$) (i.e., c includes symbols that are elements of GF($2^r$)), unless conjugacy constraints are satisfied in each block of e symbols in the transformed codeword $c^F$. The proposed Fourier-transformed method focuses on the case that m is binary. An e-tuple vector w is binary if and only if the symbols in its Fourier transform d=F(w) satisfy the conjugacy constraints:

$$d_{(2i)_e} = d_i^2 \quad \text{Eq. 6}$$

where $(2i)_e$ denotes 2i modulo e. To make the encoder output binary for binary messages, the proposed Fourier-transformed method includes permuting $G^F$ and carrying out mappings on m. The rows of $G^F$ are permuted according to $$\pi_{row} = [0, e, 2e, \ldots, (k-1)e, 1, e+1, 2e+1, \ldots, (k-1)e+1, e-1, 2e-1, \ldots, ke-1]. \quad \text{Eq. 7}$$

The permutation results in row e of $G^F$ becoming the second row after permutation, row 2e of $G^F$ becoming the third row after permutation, etc. The columns of $G^F$ are also permuted in a similar way. The row-and-column-permuted transformed generator matrix $G^{F,\pi}$ is zero except for e nonzero matrices of dimension k×n in the diagonal. In addition, an e-tuple vector formed by the entries in the same row and column inside each of these e submatrices satisfies the conjugacy constraints, such that the conjugacy constraints are satisfied in an "inter-block" manner. The input message m is also divided into e blocks of k messages and mapped to $\hat{m}$ to satisfy the conjugacy constraints in an inter-block manner. The indexes of the elements that satisfy the conjugacy constraints form cyclotomic cosets {i, (2i)e, ($2^2$i)e, ..., ($2^{n_i-1}$i)e}. The cardinality of each coset, $\eta_i$, is a divisor of r. Using {$\beta_{i,0}, \beta_{i,1}, \ldots \beta_{i,\eta_i-1}$} as a basis of the subfield GF($2^{n_i}$), the message mapping for each cyclotomic coset and $\mu$=0, 1, ..., $\eta_{i-1}$, j=0, 1, ..., k−1 is performed according to:

$$\hat{m}_{(2^\mu i)_e k+j} = (\Sigma_{l=0}^{n_i-1} \beta_{i,l} m_{(2^l i)_e k+j})^{2^\mu}. \quad \text{Eq. 8}$$

$\hat{m}G^{F,\pi}$ satisfies the conjugacy constraints in an inter-block manner. If reversely permuted, $\hat{m}G^{F,\pi}$ would become a vector that satisfies the conjugacy constraints in an intra-block manner, i.e. each block of e consecutive symbols satisfies the conjugacy constraints. As a result, a binary codeword can be derived as follows:

$$c = \hat{c}^{F,\pi^{-1}} V^{-1(n)} = (\hat{m}G^{F,\pi})^{\pi^{-1}} V^{-1(n)}. \quad \text{Eq. 9}$$

It should be noted that the codeword c computed according to Eq. 9 is different from the codeword mG generated according to conventional non-Fourier transformed methods. However, the codeword c computed according to Eq. 9 is a valid codeword.

Despite the benefit of the proposed Fourier-transformed encoding of Eq. 9 that the number of multipliers for computing $\hat{m}G^{F,\pi}$ is reduced as compared to the number of multipliers used for calculating mG—the Fourier-transformed encoding according to Eq. 9 has several drawbacks. For example, the permutation of $G^F$ and the reverse permutation of $\hat{c}^F$ complicate their storage and access. Also, inter-block message mapping is needed to derive $\hat{m}$ according to the conjugacy constraints of Eq. 8. Because the indices in a cyclotomic coset can be far apart, a large number of blocks of input messages have to be buffered such that a sufficient portion of the input message m is available to generate each symbol of the mapped message $\hat{m}$. In addition to the message mapping of Eq. 8, a reverse mapping is also needed in a decoder to recover the original message m. The overhead introduced by the message mapping of Eq. 8 may offset any savings resulting from the less-complicated multiplication of $\hat{m}$ by $G^{F,\pi}$ of the proposed Fourier-transform encoding method according to Eq. 9. In addition, the proposed Fourier-transform encoding method according to Eq. 9 is limited to binary LDPC codes.

Figure 1:
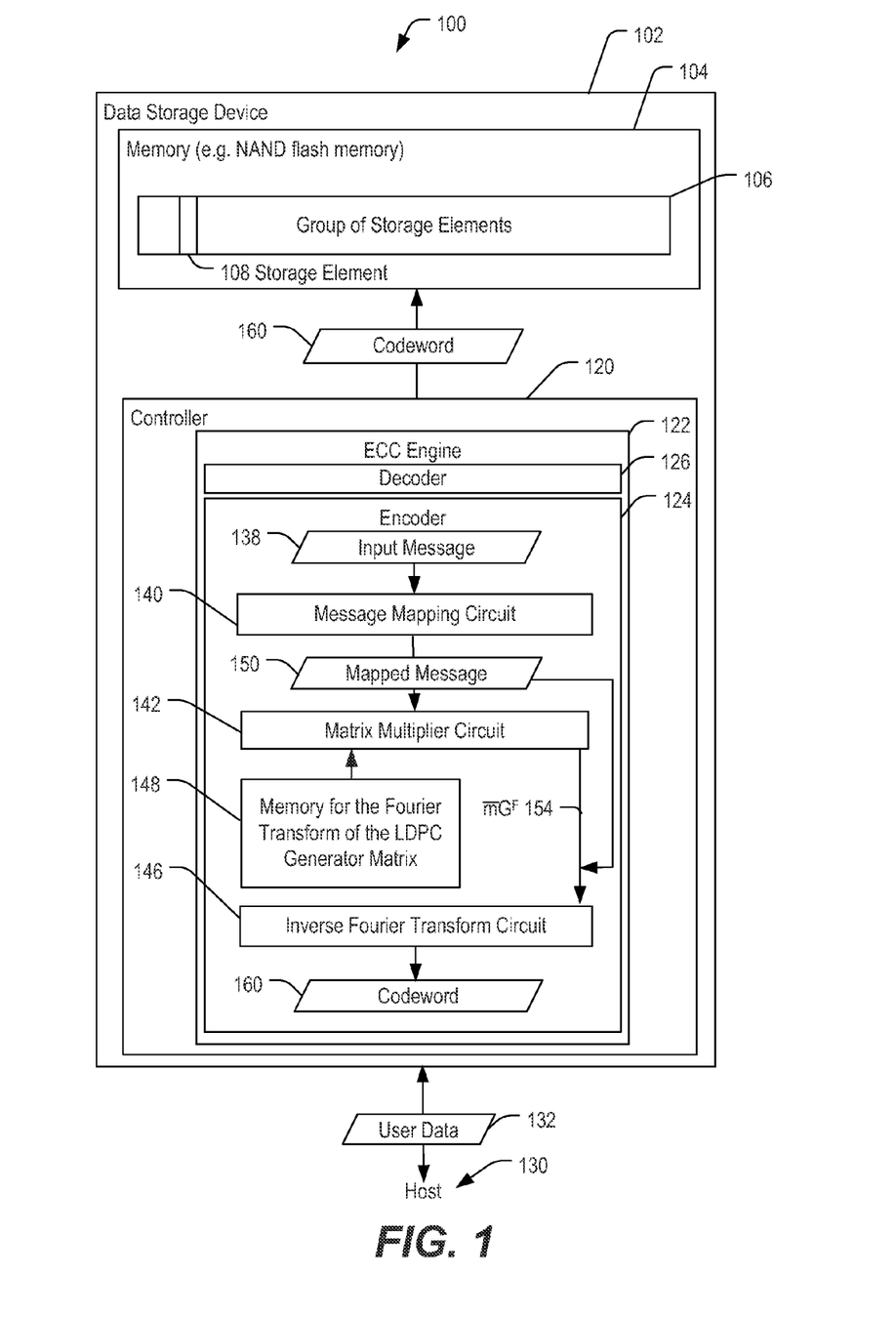
FIG. 1 is a block diagram of a particular illustrative embodiment of a system including a data storage device having a low-density parity-check (LDPC) encoder configured to generate an LDPC codeword based on a non-permuted Fourier transform of an LDPC generator matrix.

FIG. 1 illustrates a system 100 that includes a data storage device 102 coupled to a host device 130. The data storage device 102 includes an encoder 124 that is a low-complexity transform encoder for QC-LDPC codes over subfields. For example, the generator matrix of the QC-LDPC codes can consist of circulants of dimension $(2^r-1) \times (2^r-1)$, with the nonzero entries being elements of subfield $GF(2^p)$, where p is a divisor of r. Binary LDPC codes are supported as a special case of such LDPC codes with p=1. The encoder 124 is configured to multiply messages with a generator matrix consisting of diagonal sub-matrices, and hence can be implemented using much fewer multipliers than conventional, non-transform encoders. In addition, the encoder 124 overcomes disadvantages described with respect to the proposed Fourier-transform encoding scheme that is based on Eq. 9.

The host device 130 may be configured to provide data, such as the user data 132, to be stored at a memory 104 of the data storage device 102 or to request data to be read from the memory 104. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 communicates via a memory interface that enables reading from the memory 104 and writing to the memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the memory 104 in accordance with any other suitable communication protocol.

The data storage device 102 includes the memory 104 coupled to a controller 120. The memory 104 may be a non-volatile memory, such as a NAND flash memory, and the memory 104 may have a planar configuration or a three-dimensional (3D) configuration, as illustrative, non-limiting examples. To illustrate, the memory 104 may include a non-volatile memory having a three-dimensional (3D) configuration that is monolithically formed in one or more physical levels of arrays of memory cells having an active area above a silicon substrate. The memory 104 may also include circuitry associated with operation of the memory cells, such as read/write circuitry. The memory 104 includes a representative group 106 of storage elements, such as a word line of a multi-level cell (MLC) flash memory. The group 106 includes a representative storage element 108, such as a flash MLC cell. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The controller 120 is configured to receive data and instructions from and to send data to the host device 130 while the data storage device 102 is operatively coupled to the host device 130. The controller 120 is further configured to send data and commands to the memory 104 and to receive data from the memory 104. For example, the controller 120 is configured to send data (e.g., a codeword 160) and a write command to instruct the memory 104 to store the data to a specified address. As another example, the controller 120 is configured to send a read command to read data from a specified address of the memory 104.

The controller 120 includes an ECC engine 122 that is configured to receive data to be stored to the memory 104 and to generate a codeword. The ECC engine 122 includes the encoder 124 configured to encode data using a quasi-cyclic low-density parity-check (QC-LDPC) ECC encoding scheme or "ECC code." The ECC engine 122 also includes a decoder 126. The decoder 126 is configured to decode data read from the memory 104 to detect and correct, up to an error correction capability of the ECC code, any errors that may be present in the data.

The encoder 124 includes a message mapping circuit 140 configured to apply a mapping to a received input message 138 to generate a mapped message 150. A matrix multiplier circuit 142 is configured to multiply the mapped message 150 with columns of a Fourier transform of a LDPC generator matrix ($G^F$) that may be stored in a memory 148 to generate a parity portion 154 of a transformed codeword. The mapped message 150 and the parity portion 154 of the transformed codeword may be combined to form the transformed codeword and provided to an inverse Fourier transform circuit 146. The inverse Fourier transform circuit 146 is configured to perform an inverse Fourier transform of the transformed codeword to generate the codeword 160. Examples of architectures that may be used in the message mapping circuit 140 and in the matrix multiplier circuit 142 are described with reference to FIG. 2 and FIG. 3, respectively.

The encoder 124 has reduced complexity as compared to conventional LDPC decoders and as compared to the transformed Fourier encoding scheme based on Eq. 9. Processing at the encoder 124 for a QC-LDPC code whose generator matrix and message symbols are over subfield $GF(2^p)$ is performed by extending the conjugacy constraints to make the codeword output from the transformed encoding in the same subfield as the generator matrix and the message symbols. An $e=2^r-1$ tuple vector w is over subfield GF($2^p$) if and only if the symbols in its Fourier transform d=F(w) satisfy the following conjugacy constraints:

$$d_{(2^p i)_e} = d_i^{2^p}. \qquad \text{Eq. 10}$$

When the entries of G are elements of GF($2^p$), the entries in each of the diagonal sub-matrices in $G^F$ satisfy the constraints in Eq. 10. Therefore, to make the resulting codeword over subfield GF($2^p$), the cyclotomic cosets {i, ($2^p$i)e, ($2^{2p}$i)e, ..., ($2^{(\eta i-1)p}$i)e} are used in the message mapping, and the cardinality ηi of each coset is a divisor of r/p.

In the proposed Fourier transformed encoding based on Eq. 9, $G^F$ is permuted to satisfy the conjugacy constraints in an inter-block manner After the mapped messages are multiplied, the product is reversely permuted to satisfy the conjugacy constraints in an intra-block manner. However, the entries in each of the diagonal submatrices of $G^F$ already satisfy the conjugacy constraints in an intra-block manner. If the mapped massages also satisfy the conjugacy constraints in an intra-block manner, then no permutation is required on $G^F$ and the product of the mapped message with $G^F$ does not need to be reversely permuted. The message mapping circuit 140 may therefore be configured to perform intra-block message mapping as:

$$\overline{m}_{ej+(2^{p\mu} i)_e} = (\Sigma_{l=0}^{\eta_i - 1} \beta_{i,l} m_{ej+(2^{pl} i)_e})^{2^{p\mu}} \qquad \text{Eq. 11}$$

where μ=0, 1, ..., $\eta_i$-1; j=0, 1, ..., k-1; and {$\beta_{i,0}$, $\beta_{i,1}$, ... $\beta_{i,\eta_i-1}$} is a basis of the subfield GF(($2^p$)$^{\eta_i}$). Accordingly, the encoder 124 may generate the codeword (c) 160 as:

$$c = \overline{c}^F V^{-1(n)} = (\overline{m} G^F) V^{-1(n)}. \qquad \text{Eq. 12}$$

For a given message vector m, the codeword c computed from Eq. 12 may be different from the codeword generated by a conventional encoder. However, because $cH^T=0$, the codeword c is a valid codeword.

The message mapping circuit 140 may be configured to process the input message (m) 138 as k blocks of e message symbols and to perform the mapping of Eq. 11 on the message symbols in the same block (where common values of j in Eq. 11 indicate common blocks of message symbols). For example, in an implementation where the symbols of the input message 138 arrive at the message mapping circuit 140 in a partial-parallel manner, the message mapping circuit 140 may buffer a single block of e message symbols at a time. In contrast to the message mapping circuit 140, the inter-block message mapping of Eq. 8 (corresponding to the proposed Fourier-transformed encoding method based on Eq. 9) may involve mapping message symbols from blocks that are far apart. For example, when r=6 and p=2, one cyclotomic coset is {3, 12, 48} and hence message blocks 3 through 48 would need to be buffered for the corresponding message mapping.

In further contrast to the proposed Fourier-transformed encoding method based on Eq. 9, the encoder 124 does not perform any row or column permutation of the Fourier transform of the generator matrix ($G^F$). Avoiding row permutations and column permutations of $G^F$ simplifies access to the memory 148, and no buffer or routing network is needed for processing results of the matrix multiplier circuit 142 prior to the inverse Fourier transform circuit 146. As a result, the intra-block message mapping and encoding of the encoder 124 not only enables substantial reduction on the buffer size for the message mapping circuit 140 but also enables much simpler dataflow due to avoiding permutations and reverse permutations.

The message mapping circuit 140 may implement message mapping as basis multiplications followed by additions (e.g., according to Eq. 11). However, if the basis is not chosen properly, it may be difficult to recover m from the mapped messages in the decoder. For cyclotomic cosets of the same cardinality, the same basis can be used. Moreover, the symbols of m are elements of GF($2^p$), a subfield of GF($2^r$), from which the symbols of $\overline{m}$ are drawn. The composite field GF(($2^p$)$^t$) (t=r/p), which is isomorphic to GF($2^r$), can be adopted to reduce the mapping complexity. Assume that f(x) is a degree-t polynomial that is irreducible over GF($2^p$). An element of GF(($2^p$)$^t$) can be represented as $a_0 + a_1 x + \ldots + a_{t-1} x^{t-1}$, where $a_s \in$ GF($2^p$) for 0≤s<t and x is a root of f(x). $\eta_i$ should be a divisor of t. When $\eta_i$=t, the basis for the message mapping may be {$\beta_{i,0}$, $\beta_{i,1}$, ... $\beta_{i,t-1}$}={1, x, ..., $x^{t-1}$}. In this case, proper symbols of m can be collected to be the $a_s$ coefficients of each $\overline{m}_{ej+i}$ in composite field representation, without requiring any logic computation. $\overline{m}_{ej+(2^{p\mu} i)_e}$ for μ>0 can be computed by iteratively taking the $2^p$th power of $\overline{m}_{ej+i}$, which can be implemented by simple logic for finite fields of characteristic two. Similarly, the reverse mapping can be performed by assigning the $a_s$ coefficients in each $\overline{m}_{ej+i}$ to proper symbols in m. Hence, the reverse mapping also does not require any logic computation. If $\eta_i$=1, no mapping is used. When 1<$\eta_i$<t each of the β in the basis can be an element of the subfield GF (($2^p$)$^{\eta_i}$), where $\eta_i$ of the elements that have nonzero values $a_s$ at distinct locations are selected to form a basis of the subfield. The mapping and reverse mapping using this basis can be performed in a similar way as in the case of $\eta_i$=t.

Simplified message mapping and reverse mapping as explained above are a result of use of composite fields. Composite fields may also provide additional benefits. For example, composite field multipliers have lower complexity than the multipliers in the original field. Composite fields also enable simplifications of the Fourier transform over subfields.

Figure 2:
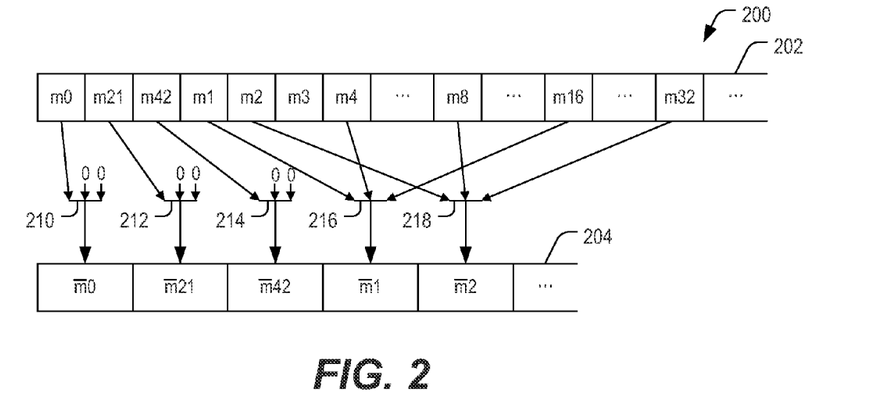
FIG. 2 is a block diagram illustrating a particular embodiment of the message mapping circuit of FIG. 1.
Figure 3:
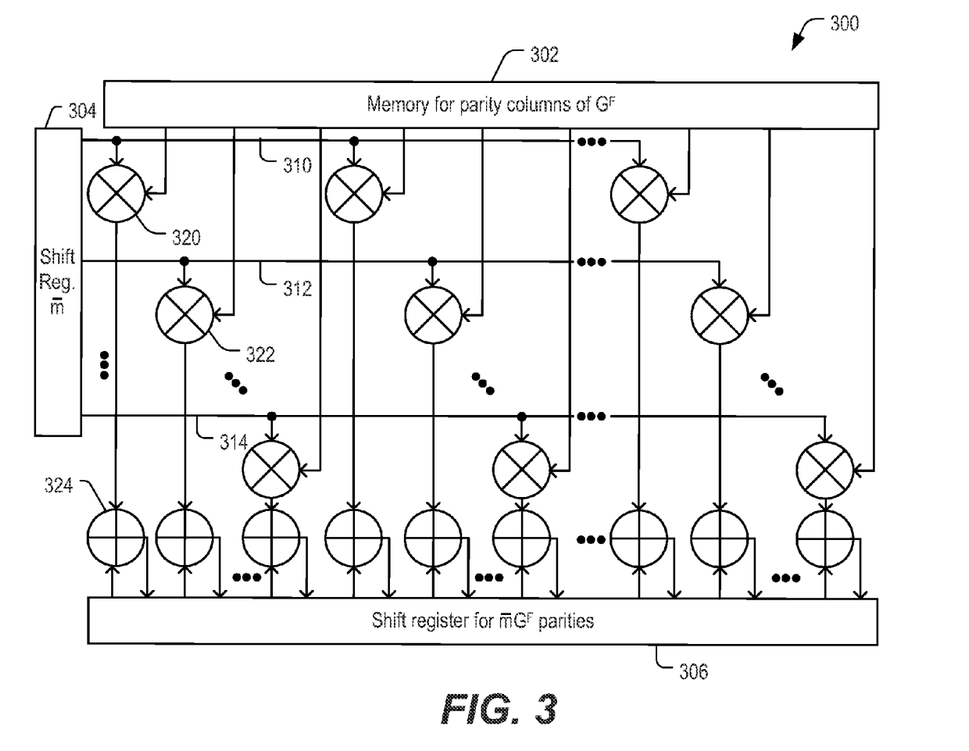
FIG. 3 is a block diagram illustrating a particular embodiment of the matrix multiplier circuit of FIG. 1.

FIGS. 2-3 illustrate architectures that may be used to implement elements of the encoder 124. To simplify notations, a non-binary QC-LDPC (QCNB-LDPC) code with symbols from GF($2^2$) (p=2) is used as an example. The G matrix of this code has circulant matrices of dimension 63×63 (r=6). However, the present disclosure is not limited to this particular example.

To construct GF(($2^p$)$^t$) from GF($2^p$), a degree-t polynomial, f(x), that is irreducible over GF($2^p$) is used. As explained previously, an element a ∈GF(($2^p$)$^t$) can be represented as a polynomial in x with maximum degree t−1, $a_{t-1} x^{t-1} + \ldots + a_1 x + a_0$, whose coefficients are elements of GF($2^p$). The element can also be represented as a vector [$a_{t-1}$, ..., $a_1$, $a_0$]. These two representations (polynomial and vector) are used interchangeably in the present disclosure. Finite field multiplication is defined as polynomial multiplication modulo f(x), and field addition is performed as polynomial addition. GF($2^2$) can be constructed using $f_0(x) = x^2 + x + 1$, the only degree-2 irreducible polynomial over GF(2). However, for constructing GF(($2^2$)$^3$) from GF($2^2$), there are several options for the irreducible polynomial. Irreducible polynomials with fewer nonzero terms may be used to reduce the complexity of finite field multiplication. For example, $f_1(x) = x^3 + \phi$, where φ='10'∈GF($2^2$), is a degree-3 irreducible polynomial over GF($2^2$) that has the least number of nonzero terms.

An example of the conjugates of $\in \in GF(2^6)$ with respect to $GF(2^2)$ are $\beta, \beta^4, \beta^{4^2}, \ldots$ If a is a primitive element of $GF(2^6)$, the conjugacy classes of $GF(2^6)$ with respect to $GF(2^2)$ are provided in Table 1.

TABLE 1

| {1} | {$\alpha^{21}$} | {$\alpha^{42}$} |
|---|---|---|
| {$\alpha, \alpha^4, \alpha^{16}$} | {$\alpha^2, \alpha^8, \alpha^{32}$} | {$\alpha^3, \alpha^{12}, \alpha^{48}$} |
| {$\alpha^5, \alpha^{20}, \alpha^{17}$} | {$\alpha^6, \alpha^{24}, \alpha^{33}$} | {$\alpha^7, \alpha^{28}, \alpha^{49}$} |
| {$\alpha^9, \alpha^{36}, \alpha^{18}$} | {$\alpha^{10}, \alpha^{40}, \alpha^{34}$} | {$\alpha^{11}, \alpha^{44}, \alpha^{50}$} |
| {$\alpha^{13}, \alpha^{52}, \alpha^{19}$} | {$\alpha^{14}, \alpha^{56}, \alpha^{35}$} | {$\alpha^{15}, \alpha^{60}, \alpha^{51}$} |
| {$\alpha^{22}, \alpha^{25}, \alpha^{37}$} | {$\alpha^{23}, \alpha^{29}, \alpha^{53}$} | {$\alpha^{26}, \alpha^{41}, \alpha^{38}$} |
| {$\alpha^{27}, \alpha^{45}, \alpha^{54}$} | {$\alpha^{30}, \alpha^{57}, \alpha^{39}$} | {$\alpha^{31}, \alpha^{61}, \alpha^{55}$} |
| {$\alpha^{43}, \alpha^{46}, \alpha^{58}$} | {$\alpha^{47}, \alpha^{62}, \alpha^{59}$} | |

The corresponding cyclotomic cosets are provided in Table 2.

TABLE 2

| {0} | {21} | {42} |
|---|---|---|
| {1, 4, 16} | {2, 8, 32} | {3, 12, 48} |
| {5, 20, 17} | {6, 24, 33} | {7, 28, 49} |
| {9, 36, 18} | {10, 40, 34} | {11, 44, 50} |
| {13, 52, 19} | {14, 56, 35} | {15, 60, 51} |
| {22, 25, 37} | {23, 29, 53} | {26, 41, 38} |
| {27, 45, 54} | {30, 57, 39} | {31, 61, 55} |
| {43, 46, 58} | {47, 62, 59} | |

If 1<e message symbols are input to the encoder 124 at a time, the messages are buffered in a register array that holds e $GF(2^p)$ symbols. When the e messages in a block have arrived, the message mapping may be performed on the e message symbols in parallel (e.g., simultaneously). The cardinality of each cyclotomic coset in Table 2 is either one or three. For the cyclotomic cosets having cardinality of one, no mapping is performed. For the cyclotomic cosets having cardinality of three, a common mapping basis can be selected as $\beta_0=1$, $\beta_{1=x}$, and $\beta_{2=x}{}^2$, where x is a root of $f_1(x)$. In this case, a symbol in $\overline{m}$ whose index is the leading term of a cyclotomic coset is simply derived by collecting the three input message symbols whose indexes belong to that cyclotomic coset. For example, $\overline{m}_5 = m_5 + m_{20}x + m_{17}x^2$. An architecture to perform message mapping is described with respect to FIG. 2.

FIG. 2 illustrates an example architecture 200 of the message mapping circuit 140 configured to perform intra-block message mapping for $GF((2^2)^3)$ elements. The architecture 200 illustrates circuit elements 210-218 coupled to receive symbols of an input message 202 (e.g., the input message 138 of FIG. 1) and to generate symbols of a mapped message 204 (e.g., the mapped message 150 of FIG. 1). The symbols of the input message 202 may be received according to a message symbol order, such as the order m0, m1, . . . , m63, and buffered until a block of e (in this example, e=63) input message symbols are available for processing.

Each of the circuit elements 210-218 is configured to generate a mapped message symbol based on the symbols of the input message 202 whose indices form the corresponding cyclotomic coset. As an example of a cyclotomic coset having a cardinality of one, the circuit element 210 is configured to generate the symbol $\overline{m}0$ of the mapped message 204 based on the symbol m0 of the input message 202. "Zero" values are illustrated at second and third inputs to the circuit element 210, indicating that $\dot{m}0$ is generated as a function of m0 only. As an example of a cyclotomic coset having a cardinality of three, the circuit element 214 is configured to generate the symbol $\overline{m}_1$ of the mapped message 206 based on the symbols m1, m4, and m16 of the input message 202.

Each of the circuit elements 210-218 may be configured to generate its respective mapped message symbol according to Eq. 11. For example, in some implementations, each of the circuit elements 210-218 may be configured to perform a sum of multiplicative products involving the basis elements and the input message symbols as indicated in Eq. 11. However, using a basis selection as described above simplifies implementation of Eq. 11 to combining (e.g., concatenating, appending, routing, etc.) the input message symbols to form a mapped message symbol. In the example of FIG. 2, each of the circuit elements 210-218 combines three 2-bit values (0 values or symbols of the input message 202) to form a 6-bit symbol of the mapped message 204.

Although the input message 202 is illustrated as having symbols arranged such that elements of the cyclotomic cosets having cardinality of one precede elements of the cyclotomic cosets having cardinality of three for clarity of explanation, it should be understood that the input message symbols may be received and/or buffered in any order. Similarly, although the mapped message 204 is illustrated as having symbols arranged such that elements of the cyclotomic cosets having cardinality of one precede elements of the cyclotomic cosets having cardinality of three for clarity of explanation, it should be understood that the mapped message symbols may be generated and/or buffered in any order.

In the present disclosure, the symbols whose indexes are the leading terms of the cyclotomic cosets are referred to as the "leading symbols." To further reduce complexity, the architecture 200 of the message mapping circuit 140 may compute the leading symbols of $\overline{m}$ without computing the non-leading symbols of each cyclotomic coset.

To illustrate, each of the e×e submatrices in the parity columns of the transformed generator matrix, $G^F$, is a diagonal matrix, and the entries in the diagonal satisfy the conjugacy constraints. Each block of the e symbols in $\overline{m}G^F$ also satisfy the conjugacy constraints. Hence, only the leading symbols of $\overline{m}G^F$ need to be computed at the matrix multiplier circuit 142 of FIG. 1, and the other symbols can be recovered by taking the $2^p$th power of the leading symbols. Generating the $2^p$th power of a symbol can be performed with less complexity than that of a general multiplier. Therefore, for the entries in each diagonal submatrix of $G^F$, only the leading symbols need to be stored and multiplied to the leading symbols of $\overline{m}$. This reduces the memory requirement for storing $G^F$ (e.g., the size of the memory 148 to store elements of $G^F$). In addition, the number of multiplications that are performed are reduced to the number of leading symbols. The $2^p$th exponentiation computations (i.e., computation of non-leading symbols of the transformed codeword 154) may be performed after the leading symbols in the product $\overline{m}G^F$ are calculated. As a result, substantially fewer multipliers are used as compared to implementations where all leading and non-leading symbols are computed via multiplication.

FIG. 3 shows a partial-parallel architecture 300 of the matrix multiplier circuit 142 of FIG. 1 for generator matrix multiplication. A memory 302 (e.g., the memory 148 of FIG. 1) stores data corresponding to non-zero elements of the parity columns of the transformed generator matrix $G^F$. A shift register 304 is configured to receive symbols of the mapped message 150 of FIG. 1 and to provide mapped message symbols via outputs 310-314 to a group of multiplier circuits including a first representative multiplier 320 and a second representative multiplier 322. Outputs of multipliers are coupled to first inputs of adders, such as a representative adder 324. Second inputs of the adders and output of the adders are coupled to a shift register for parity symbols 306 that includes multiple shift registers, such as one shift register for each parity column of $G^F$.

In a particular implementation, there are l' outputs 310-314 so that in each clock cycle, l' leading symbols of $\overline{m}$ are simultaneously multiplied with all the nonzero entries in the corresponding rows of $G^F$. l' may be selected so that the throughput of the matrix multiplication in the matrix multiplier circuit 142 matches the rate of receiving encoder input symbols in order to reduce an amount of buffers. For example, when l=8 and e=63, a block of symbols of the input message are received over ⌈63/8⌉=8 clock cycles. For reduced buffering, matrix multiplication involving the mapped symbols in a block should be completed over 8 clock cycles. In the case of p=2 and r=6, there are 23 cyclotomic cosets so that the multiplications of 23 leading symbols are completed in 8 clock cycles. Hence, the number of outputs 310-314 of the shift register 304 can be determined as l'=⌈23/8⌉=3.

Since the parity part of $G^F$ consists of n-k block columns of diagonal submatrices, n-k multipliers may be implemented for each leading symbol of $\overline{m}$ output from the shift register 304. The intermediate products of $\overline{m}$ and $G^F$ for all parity columns may be stored in the shift register for parity symbols 306. In every clock cycle, the output of each multiplier is accumulated to the intermediate result belonging to the same column of $G^F$. For example, in each clock cycle, the output of the multiplier 320 (corresponding to a particular parity column of $G^F$) is added to the accumulated value for the particular parity column from the shift register for parity symbols 306 and the accumulated result is stored into the shift register for parity symbols 306. The registers of the shift register for parity symbols 306 may be shifted by l' positions each time, so that the connections between the multipliers and registers may remain unchanged.

Components of the encoder 124 may be configured to match the rate of receiving encoder input symbols, while reducing a number and size of buffers and registers used for storage during encoding. For example, if l symbols (l<e) of the input message (m) 138 are input at a time, the l symbols may be stored into a shift register inside the message mapping circuit 140 that is configured to hold e symbols over $GF(2^p)$. After e symbols of the input message (m) 138 are collected, the leading symbols of the corresponding mapped message ($\overline{m}$) 150 can be derived according to the cyclotomic cosets by the architecture 200 of FIG. 2 of the message mapping circuit 140. In the matrix multiplier circuit 142, the shift register 304 of FIG. 3 holding the leading symbols of $\overline{m}$ may be sized to store e'r-bits, where e' is the number of cyclotomic cosets. The shift register 304 may shift out l' leading symbols of $\overline{m}$ at a time (e.g., each clock cycle) that are multiplied with the entries of the parity part of the transformed generator matrix ($G^F$) using the architecture 300 of FIG. 3. To reduce a size of the memory 302, the leading symbols in each diagonal submatrix of $G^F$ may be stored in the memory 302 without storing non-leading symbols of $G^F$. As explained previously, to avoid data build-up, l' may be chosen so that the number of clock cycles for the encoder 124 to receive a block of the input message (m) 138 equals the number of clock cycles it takes for the matrix multiplier circuit 142 to complete multiplication corresponding to the block of the input message (m) 138, i.e., ⌈e/l⌉=⌈e'/l'⌉.

The outputs of the matrix multiplication circuit 142 are parity symbols of a transformed codeword. The mapped message ($\overline{m}$) 150 is sent to the matrix multiplication circuit 142 and the mapped message ($\overline{m}$) 150 is also routed to the output of the matrix multiplication circuit 142 to become systematic symbols of the transformed codeword. Both systematic and parity symbols are provided to the inverse Fourier transform circuit 146 to derive the codeword 160. In some implementations, the non-leading symbols of the transformed codeword $\overline{m}G^F$ may be generated prior to the inverse Fourier transform circuit 146, and the inverse Fourier transform circuit 146 may compute the codeword 160 according to a conventional inverse Fourier transform circuit architecture. However, in other implementations, the inverse Fourier transform circuit 146 may implement an efficient architecture for inverse Fourier transform over subfields that operates on the leading symbols of the cyclotomic cosets over $GF((2^p)^r)$ and outputs blocks of e symbols over $GF(2^p)$. In such implementations, there is no need to compute the non-leading symbols of $\overline{m}G^F$ from those leading symbols.

Compared to a conventional LDPC encoder that multiplies a message vector with a generator matrix, the transformed encoder 124 of FIG. 1 can be implemented using substantially fewer multipliers. Components of the transformed encoder 124 employ composite field arithmetic so that message mapping and message inverse mapping are performed by simple wiring, such as described with respect to the circuit elements 210-218 of FIG. 2. Although an additional Fourier transform and inverse Fourier transform are implemented in the decoder and encoder as compared to a conventional LDPC decoder and encoder, the Fourier transform and inverse Fourier transform can be implemented by hardware architectures that have small silicon area and relatively low complexity by taking advantage of conjugacy constraints. Overall, the encoder 124 of FIG. 1 enables significant complexity reduction as compared to a conventional LDPC encoder.

To illustrate, for a (2016, 1764) QCNB-LDPC code over subfield $GF(2^2)$ whose generator matrix has circulants of dimension 63×63, the encoder 124 of FIG. 1 may only require 55% of the logic gates (based on architectural analysis) and slightly larger memory to achieve the same throughput as compared to a conventional LDPC encoder. For a (4064, 2921) binary QC-LDPC code whose generator matrix consists of 127×127 circulants, the encoder 124 of FIG. 1 may be implemented having a gate count that is 52% less than a gate count of a conventional LDPC encoder.

Figure 4:
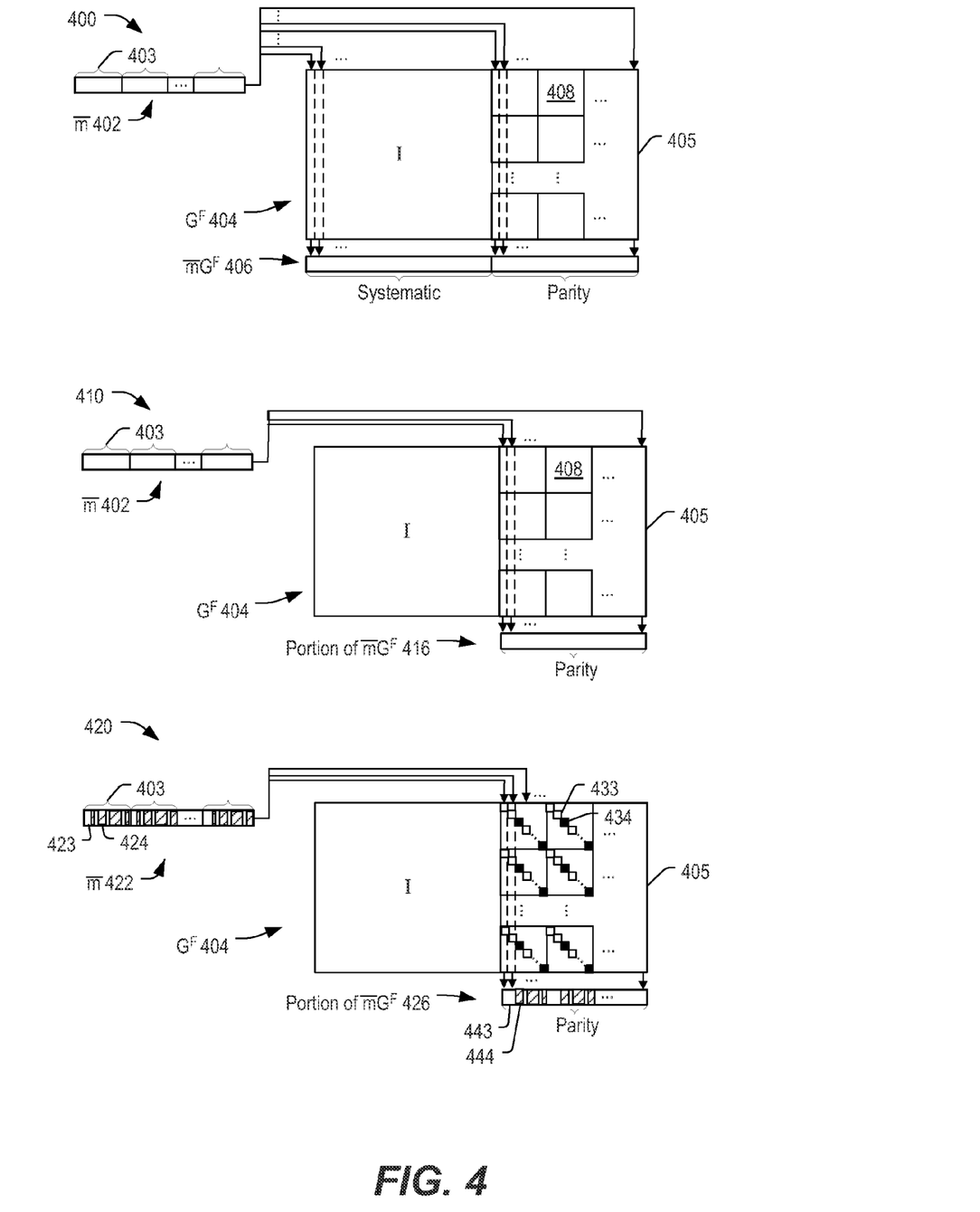
FIG. 4 is a diagram illustrating embodiments of matrix multiplication operations that may be performed by the matrix multiplier circuit of FIG. 1.

FIG. 4 depicts illustrative multiplication operations that may be performed by the matrix multiplier circuit 142 of FIG. 1. A first multiplication operation 400 illustrates a mapped message $\overline{m}$ 402 as including multiple blocks of symbols, such as a representative block 403. A Fourier transform of a generator matrix ($G^F$) 404 includes an identity portion (I) and a parity portion 405. The parity portion 405 includes multiple diagonal matrices, such as a representative diagonal matrix 408. Each of the diagonal matrices has a dimension matching the size of the blocks of the mapped message 402.

In a first embodiment, the first multiplication operation 400 multiplies the mapped message $\overline{m}$ 402 with the Fourier transform of the generator matrix 404 by multiplying the mapped message 402 with each column of the Fourier transform of the generator matrix 404. The first multiplication operation 400 produces a transform of an LDPC codeword ($\overline{m}G^F$) 406 having a "systematic" portion resulting from multiplication of the mapped message $\overline{m}$ 402 with the identity portion (I) and having a parity portion resulting from multiplication of the mapped message $\overline{m}$ 402 with the parity portion 405.

In an alternate embodiment, a second multiplication operation 410 reduces an amount of multiplication processing as compared to the first multiplication operation 400 by omitting multiplication of the mapped message $\overline{m}$ 402 with the identity portion of the Fourier transform of the generator matrix ($G^F$) 404. Instead, the mapped message $\overline{m}$ 402 is multiplied with each column of the parity portion 405 to produce a portion of the transform of the LDPC codeword ($\overline{m}G^F$) 416. The resulting portion 416 corresponds to the parity portion and omits the systematic portion. The complete transform of the LDPC codeword ($\overline{m}G^F$) 406 may be formed by joining the mapped message $\overline{m}$ 402 to the parity portion of the transform of the LDPC codeword ($\overline{m}G^F$) 416.

In another alternate embodiment, a third multiplication operation 420 reduces an amount of multiplication processing as compared to the second multiplication operation 410 by omitting multiplication of symbols of the mapped message $\overline{m}$ 402 and elements of the Fourier transform of the generator matrix ($G^F$) 404 that correspond to non-leading elements in each cyclotomic coset. As described with respect to FIG. 2, a mapped message $\overline{m}$ 422 may include symbols corresponding to leading elements, illustrated as an unshaded portion 423 of the mapped message $\overline{m}$ 422, and may omit symbols corresponding to non-leading elements, illustrated as shaded portion 424 of the mapped message $\overline{m}$ 422. In addition, as described with respect to FIG. 3, each diagonal matrix of the parity portion 405 may include matrix elements corresponding to leading elements, illustrated as unshaded matrix elements (such as a representative unshaded element 433), and may omit matrix elements corresponding to non-leading elements, illustrated as shaded matrix elements (such as a representative shaded element 434).

The resulting portion of the transform of the LDPC codeword ($\overline{m}G^F$) 426 includes symbols corresponding to leading elements of the parity portion (e.g., an unshaded portion 443) but excludes the systematic portion and also excludes symbols corresponding to non-leading elements of the parity portion (e.g., a shaded portion 444). Because fewer multiplications are performed as compared to the second multiplication operation 410, a smaller number of dedicated multipliers may be used without reducing the throughput of the overall encoder.

Figure 5:
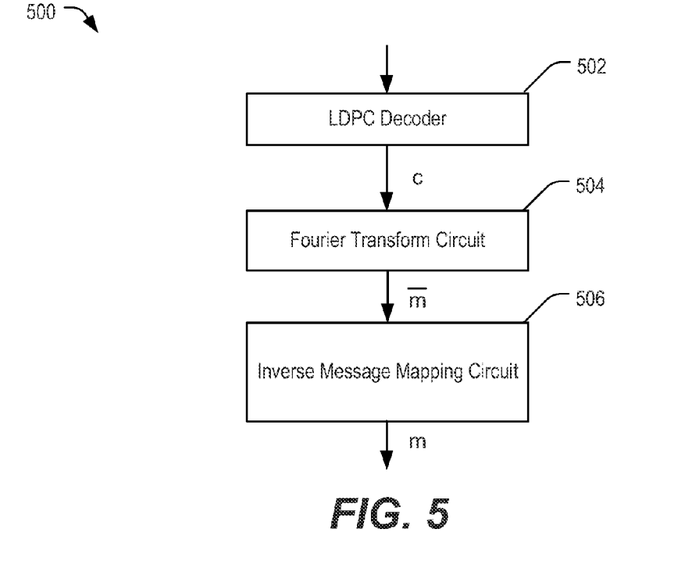
FIG. 5 is a block diagram illustrating a particular embodiment of the LDPC decoder of FIG. 1.

FIG. 5 illustrates a decoder 500 configured to decode a data word that may correspond to a corrupted version of the codeword 160 (i.e., the data word differs from the codeword 160 due to one or more errors). The decoder 500 includes an LDPC decoder 502, a Fourier transform circuit 504 coupled to an output of the LDPC decoder 502, and an inverse message mapping circuit 506 coupled to an output of the Fourier transform circuit 504.

During operation, a data word may be processed by the LDPC decoder 502 and decoding results (e.g., the codeword (c) 160 of FIG. 1) may be provided to the Fourier transform circuit 504. The Fourier transform circuit 504 is configured to apply a Fourier transform to the systematic part of the LDPC decoding results, which are symbols over GF($2^p$). The outputs of the Fourier transform circuit 504 is a mapped message ($\hat{m}$), such as the mapped message 150 of FIG. 1, having symbols over GF(($2^p$)$^r$). The mapped message is provided to the inverse message mapping circuit 506, where the leading symbols of $\overline{m}$ are reversely mapped to recover each symbol in the message (m), such as the input message 138 of FIG. 1.

Figure 6:
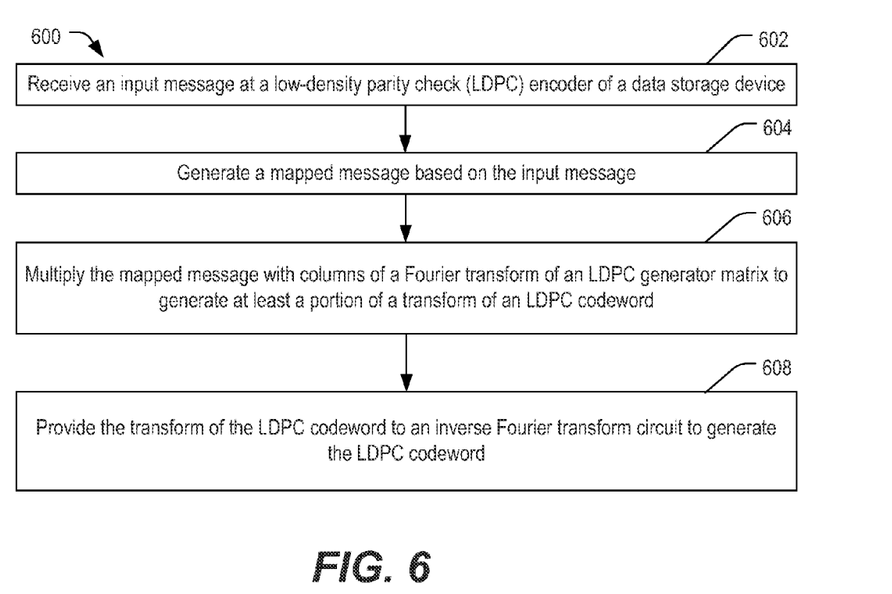
FIG. 6 is a flow chart of a particular illustrative embodiment of a method of encoding data that may be performed at the LDPC encoder of FIG. 1.

Referring to FIG. 6, a particular embodiment of a method 600 is depicted. The method 600 may be performed at a quasi-cyclic low-density parity-check (QC-LDPC) encoder of a data storage device, such as the data storage device 102 of FIG. 1. An input message is received, at 602.

A mapped message is generated based on the input message, at 604. Generating the mapped message may include processing multiple sequential groups of message symbols of the input message to generate, for each particular group of the multiple sequential groups, a corresponding portion of the mapped message based on the message symbols of the particular group and independent of the other groups of the multiple sequential groups. For example, the architecture 200 of FIG. 2 may be used to implement the message mapping circuit 140 of FIG. 1 to perform mapping of the input message 138 in accordance with Eq. 11. Each of the groups of message symbols may include e elements so that a count of the message symbols (e) that are in each of the multiple sequential groups matches a dimension of a circulant matrix (e.g., a circulant matrix with e rows and e columns) within the LDPC generator matrix.

In a particular embodiment, the transformed LDPC generator matrix includes matrix elements that are elements of a finite field and the LDPC generator matrix includes matrix elements that are elements of a subfield of the finite field. The message symbols of the input message are elements of the subfield, and the symbols of the mapped message are elements of the finite field. Generating the mapped message may include, for each of the multiple sequential groups, generating the mapped message symbols with indices corresponding to leading elements of cyclotomic cosets of the finite field with respect to the subfield without generating mapped message symbols with indices corresponding to non-leading elements of the cyclotomic cosets. For example, referring to the cyclotomic cosets depicted in Table 2, mapped message symbols may be generated for indices 0, 1, 2, 3, 5, 6, 7, 9, 10, 11, 13, 14, 15, 21, 22, 23, 26, 27, 30, 31, 42, 43, and 47 and may not be generated for the remaining indices.

The mapped message is multiplied with columns of a Fourier transform of an LDPC generator matrix to generate at least a portion of a transform of an LDPC codeword, at 606. For example, the mapped message 402 may be multiplied as shown in the multiplication operation 400 of FIG. 4 to generate the transform of the LDPC codeword ($\overline{m}G^F$) 406. As another example, as shown in the multiplication operation 410 of FIG. 4, the mapped message 402 may be multiplied with columns of the parity portion 405 of FIG. 4 to generate the parity portion of the transform of the LDPC codeword ($\overline{m}G^F$) 416. As another example, as shown in the multiplication operation 420 of FIG. 4, symbols of the mapped message that includes leading elements and omits non-leading elements 422 may be multiplied with elements of columns of the parity portion 405 that include leading elements and that omit non-leading elements, to generate the leading elements of the parity portion of the transform of the LDPC codeword ($\overline{m}G^F$) 426, further reducing a number of dedicated multipliers, buffering, and matrix element storage used for the multiplication.

The transform of the LDPC codeword is provided to an inverse Fourier transform circuit to generate the LDPC codeword, at 608. For example, the mapped message 150 of FIG. 1 may be combined with the parity portion of the output of the matrix multiplier circuit 142 and provided to an input of the inverse Fourier transform circuit 146 of FIG. 1. No permutation is performed to the transform of the LDPC codeword (e.g., the $\pi^{-1}$ permutation of Eq. 9 is avoided).

The method 600 is not limited to binary codewords. For example, in some implementations, the LDPC codeword is formed of binary symbols. In other implementations, the LDPC codeword may be formed of non-binary symbols.

Although various components depicted herein are illustrated as block components and described in general terms, such components may include one or more microprocessors, state machines, or other circuits configured to enable the encoder 124 of FIG. 1 to perform encoding to generate a codeword. For example, the encoder 124 may represent physical components, such as hardware controllers, state machines, logic circuits, or other structures, to enable the encoder 124 of FIG. 1 to perform message mapping, matrix multiplication, and an inverse Fourier transform as described with respect to FIG. 1.

The encoder 124 may be implemented using a microprocessor or microcontroller programmed to receive an input message, to provide the input message to a message mapping stage (e.g., as described with respect to the message mapping circuit 140), to route the mapped message to a matrix multiplier stage (e.g., as described with respect to the matrix multiplier circuit 142), and to provide a resulting transformed codeword to an inverse Fourier transform stage (e.g., as described with respect to the inverse Fourier transform circuit 146).

In a particular embodiment, the encoder 124 includes a processor executing instructions that are stored at the memory 104. Alternatively, or in addition, instructions that are executed by the processor may be stored at a separate memory location that is not part of the memory 104 (e.g., at the memory 148), such as at a read-only memory (ROM).

In a particular embodiment, the data storage device 102 may be implemented in a portable device configured to be selectively coupled to one or more external devices. However, in other embodiments, the data storage device 102 may be attached to or embedded within one or more host devices, such as within a housing of a host communication device. For example, the data storage device 102 may be within a packaged apparatus such as a wireless telephone, a tablet computer, a laptop computer, a personal digital assistant (PDA), a gaming device or console, a portable navigation device, or other device that uses internal non-volatile memory. In a particular embodiment, the data storage device 102 may include a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

Semiconductor memory devices, such as the data storage device 102 of FIG. 1, include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
   a non-volatile memory; and
   a quasi-cyclic low-density parity-check (QC-LDPC) encoder configured to encode data for storage into the non-volatile memory, the QC-LDPC encoder including:
      a message mapping circuit configured to receive an input message and to generate a mapped message based on the input message; and
      a matrix multiplier circuit configured to multiply the mapped message with columns of a Fourier transform of an LDPC generator matrix to generate at least a portion of a transform of an LDPC codeword,
   wherein the QC-LDPC encoder is configured to provide at least the portion of the transform of the LDPC codeword to an inverse Fourier transform circuit to generate the LDPC codeword.

2. The data storage device of claim 1, wherein the Fourier transform of the LDPC generator matrix includes matrix elements that are elements of a finite field, wherein message symbols of the input message are elements of a subfield of the finite field, wherein the LDPC generator matrix includes matrix elements that are elements of the subfield of the finite field, wherein mapped message symbols of the mapped message are elements of the finite field, and wherein the matrix multiplier circuit is configured to multiply mapped message symbols with elements of the columns of the transformed LDPC generator matrix based on leading elements of cyclotomic cosets of the finite field with respect to the subfield without performing multiplication of mapped message symbols with indices as non-leading elements of the cyclotomic cosets.

3. The data storage device of claim 1, wherein the message mapping circuit is configured to process multiple sequential groups of message symbols of the input message, and wherein the message mapping circuit is configured to generate, for each particular group of the multiple sequential groups, a corresponding portion of the mapped message based on the message symbols of the particular group and independent of the other groups of the multiple sequential groups.

4. The data storage device of claim 3, wherein a count of the message symbols that are in each of the multiple sequential groups matches a dimension of a circulant matrix within the LDPC generator matrix.

5. The data storage device of claim 3, wherein the Fourier transform of the LDPC generator matrix includes matrix elements that are elements of a finite field, wherein the symbols of the input message and entries of the LDPC generator matrix are elements of a subfield of the finite field, wherein mapped message symbols of the mapped message are elements of the finite field, and wherein the message mapping circuit is configured to generate, for each of the multiple sequential groups, the mapped message symbols with indices corresponding to leading elements of cyclotomic cosets of the finite field with respect to the subfield without generating mapped message symbols with indices corresponding to non-leading elements of the cyclotomic cosets.

6. The data storage device of claim 1, wherein the LDPC codeword is formed of binary symbols.

7. The data storage device of claim 1, wherein the LDPC codeword is formed of non-binary symbols.

8. The data storage device of claim 1, wherein the QC-LDPC encoder is configured to provide the mapped message to the inverse Fourier transform circuit as a systematic portion of the transform of the LDPC codeword and to provide an output of the matrix multiplier circuit to the inverse Fourier transform circuit as a parity portion of the transform of the LDPC codeword without applying a permutation to symbols of the transform of the LDPC codeword.

9. The data storage device of claim 1, wherein the QC-LDPC encoder is configured to provide the input message to the message mapping circuit during a first number of clock cycles by providing l message symbols of the input message to the message mapping circuit per clock cycle, wherein the matrix multiplier circuit is configured to compute multiplication products for l' rows of the Fourier transform of the LDPC generator matrix per clock cycle, wherein l' is less than l, and wherein the matrix multiplier circuit is configured to complete the multiplying of the mapped message with leading elements of the rows of the Fourier transform of the LDPC generator matrix in a same number of clock cycles as the first number of clock cycles.

10. The data storage device of claim 1, further comprising a controller coupled to the non-volatile memory, and wherein the controller includes the QC-LDPC encoder.

11. The data storage device of claim 1, wherein the non-volatile memory has a three-dimensional (3D) configuration that is monolithically formed in one or more physical levels of arrays of memory cells having an active area above a silicon substrate, and further comprising circuitry associated with operation of the memory cells.

12. A method comprising:
at a quasi-cyclic low-density parity-check (QC-LDPC) encoder of a data storage device, performing:
receiving an input message;
generating a mapped message based on the input message;
multiplying the mapped message with columns of a Fourier transform of an LDPC generator matrix to generate at least a portion of a transform of an LDPC codeword; and
providing at least the portion of the transform of the LDPC codeword to an inverse Fourier transform circuit to generate the LDPC codeword.

13. The method of claim 12, wherein the Fourier transform of the LDPC generator matrix includes matrix elements that are elements of a finite field, wherein the message symbols of the input message are elements of a subfield of the finite field, wherein mapped message symbols of the mapped message are elements of the finite field, wherein elements of the LDPC generator matrix are elements of the subfield, and wherein multiplying the mapped message with columns of a Fourier transform of an LDPC generator matrix includes multiplying mapped message symbols with elements of the columns of the Fourier transform of the LDPC generator matrix based on leading elements of cyclotomic cosets of the finite field with respect to the subfield without performing multiplication of mapped message symbols with indices as non-leading elements of the cyclotomic cosets.

14. The method of claim 12, wherein generating the mapped message includes processing multiple sequential groups of message symbols of the input message to generate, for each particular group of the multiple sequential groups, a corresponding portion of the mapped message based on the message symbols of the particular group and independent of the other groups of the multiple sequential groups.

15. The method of claim 14, wherein a count of the message symbols that are in each of the multiple sequential groups matches a dimension of a circulant matrix within the LDPC generator matrix.

16. The method of claim 14, wherein the Fourier transform of the LDPC generator matrix includes matrix elements that are elements of a finite field, wherein the symbols of the input message and the elements of the LDPC generator matrix are elements of a subfield of the finite field, wherein mapped message symbols of the mapped message are elements of the finite field, and wherein generating the mapped message includes, for each of the multiple sequential groups, generating the mapped message symbols with indices corresponding to leading elements of cyclotomic cosets of the finite field with respect to the subfield without generating mapped message symbols with indices corresponding to non-leading elements of the cyclotomic cosets.

17. The method of claim 12, wherein the LDPC codeword is formed of binary symbols.

18. The method of claim 12, wherein the LDPC codeword is formed of non-binary symbols.

19. The method of claim 12, wherein the mapped message is provided to the inverse Fourier transform circuit as a systematic portion of the transform of the LDPC codeword and a result of multiplying the mapped message is provided to the inverse Fourier transform circuit as a parity portion of the transform of the LDPC codeword without applying a permutation to symbols of the transform of the LDPC codeword.

20. The method of claim 12, wherein the QC-LDPC encoder includes a message mapping circuit and a matrix multiplier circuit, wherein the input message is provided to the message mapping circuit during a first number of clock cycles by providing l message symbols of the input message to the message mapping circuit per clock cycle, wherein the matrix multiplier circuit computes multiplication products for l' rows of the Fourier transform of the LDPC generator matrix per clock cycle, wherein l' is less than l, and wherein the matrix multiplier circuit is configured to complete the multiplying of the mapped message with leading elements of the rows of the Fourier transform of the LDPC generator matrix in a same number of clock cycles as the first number of clock cycles.

21. The method of claim 12, wherein the data storage device further includes a controller coupled to a non-volatile memory, and wherein the controller includes the QC-LDPC encoder.

22. The method of claim 21, wherein the non-volatile memory has a three-dimensional (3D) configuration that is monolithically formed in one or more physical levels of arrays of memory cells having an active area above a silicon substrate, and wherein the non-volatile memory further includes circuitry associated with operation of the memory cells.

* * * * *